(12) United States Patent
Furuya

(10) Patent No.: US 11,996,310 B2
(45) Date of Patent: May 28, 2024

(54) SUBSTRATE CARRYING APPARATUS

(71) Applicant: SHIBAURA MECHATRONICS CORPORATION, Yokohama (JP)

(72) Inventor: Masaaki Furuya, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 0 days.

(21) Appl. No.: 17/476,368

(22) Filed: Sep. 15, 2021

(65) Prior Publication Data

US 2022/0084861 A1  Mar. 17, 2022

(30) Foreign Application Priority Data

Sep. 16, 2020 (JP) .................... 2020-155483

(51) Int. Cl.
*H01L 21/67* (2006.01)
*B65G 47/90* (2006.01)
*H01L 21/677* (2006.01)

(52) U.S. Cl.
CPC ........ *H01L 21/67706* (2013.01); *B65G 47/90* (2013.01); *H01L 21/67167* (2013.01); *H01L 21/67173* (2013.01); *H01L 21/67712* (2013.01)

(58) Field of Classification Search
None
See application file for complete search history.

(56) References Cited

U.S. PATENT DOCUMENTS

| 8,006,850 | B2 * | 8/2011 | Rotheisler | ............... B66C 23/14 |
| | | | | 212/196 |
| 9,475,678 | B2 * | 10/2016 | Kfoury | ................ B25J 19/0016 |
| 11,380,559 | B2 * | 7/2022 | Eto | .................... H01L 21/68707 |
| 2021/0268641 | A1 * | 9/2021 | Hosek | ...................... B25J 9/126 |

FOREIGN PATENT DOCUMENTS

| CN | 102975200 A | | 3/2013 | |
| DE | 10227213 | * | 1/2004 | ............ B65G 47/90 |
| JP | H11-87461 A | | 3/1999 | |

* cited by examiner

*Primary Examiner* — Ronald P Jarrett
(74) *Attorney, Agent, or Firm* — Nath, Goldberg & Meyer; Jerald L. Meyer

(57) ABSTRACT

A substrate carrying apparatus that can reduce attachment of dust to substrates can be provided. The substrate carrying apparatus 1 of the present embodiment includes a carrying arm 2 for carrying a substrate, a column 32 standing up from a base body 31 with fixed angle, an upper link 33 which supports the carrying arm 2 at one end, which is rotatably connected to the column 32, and which moves the carrying arm 2 up and down in accordance with a rotation, a lower link 34 which is connected to be rotatable around an axis in parallel with a rotation axis of the upper link 33 as a center below a portion of the column 32 connected to the upper link 33, a connection link 35 which is rotatably connected to the upper link 33 and the lower link 34 so that the upper link 33 rotates in accordance with a rotation of the lower link 34, and a driving unit 4 which rotates the lower link 34.

10 Claims, 16 Drawing Sheets

SUBSTRATE CARRYING APPARATUS

CROSS-REFERENCE TO RELATED APPLICATION

This application is based upon and claims the benefit of priority from Japan Patent Application No. 2020-155483, filed on Sep. 16, 2020, the entire contents of which are incorporated herein by reference.

FIELD OF INVENTION

The present disclosure relates to a substrate carrying apparatus.

BACKGROUND

Substrate processing apparatuses are apparatuses to process substrates such as wafers and liquid crystal substrates in the production process of semiconductors and liquid crystal panels. For example, the processing of the substrates includes various processing such as etching, resist peeling, washing, and drying for forming circuits. In such substrate processing apparatus, a plurality of the substrates may be processed together, or the substrates may be processed one by one in terms of uniformity and reproducibility for each substrate. This processing of processing the substrates one by one is called a single wafer processing.

Furthermore, to avoid dust from attaching to the substrates, the plurality of the substrates is housed inside a sealed cassette and is carried between each substrate processing apparatus. The cassettes may be, for example, FOUP (Front-Opening Unified Pods).

The processing efficiency of the substrate processing apparatuses which perform the single wafer processing is low when compared with apparatuses which process the plurality of the substrates together, because the substrates are processed one by one in one chamber. Therefore, a plurality of the chambers is aligned and arranged inside the substrate processing apparatus in the horizontal direction, and the processing in each chamber is performed in parallel or in sequence to improve the operation efficiency.

Accordingly, in the aforementioned substrate processing apparatuses, a substrate carrying apparatus is needed to carry the substrate between the cassette and the chamber. The substrate carrying apparatus takes out the unprocessed substrate one by one from the cassette which has been carried from the previous process, carries the substrate into the chamber, and houses the substrate, which has been processed inside the chamber, in the cassette.

Furthermore, the aforementioned substrate processing apparatuses includes a buffer unit on which the substrate is temporarily placed. In addition, the substrate carrying apparatus for (carrying) the cassette to carry the substrate between the cassette base and the buffer unit and the substrate carrying apparatus for (carrying) the chamber to carry the substrate between a deliver base and the chamber are provided separately to improve the operation efficiency.

That is, the substrate carrying apparatus for cassette includes a carrying robot having a double arm, and takes out the unprocessed substrate from the cassette by one arm and returns the processed substrate to the cassette by the other arm. In addition, the carrying robot moves to a buffer area, and receives the processed substrate from the buffer area by the other arm and places the unprocessed substrate on the buffer area by the one arm.

The substrate carrying apparatus for chamber includes a carrying robot having a double arm, and receives the processed substrate from the buffer area by one arm and places the unprocessed substrate on the buffer area by the other arm. In addition, the carrying robot moves to the chamber, carries the processed substrate out of the chamber by the other arm and carries the unprocessed substrate into the chamber by the one arm.

Furthermore, to improve the producibility of the substrate processing apparatus, a number of the chambers is increased without increasing a footprint, that is, an occupied area of the apparatus by stacking the chambers vertically such that is not increased. In such a substrate processing apparatus, the substrate carrying apparatus for chamber needs a mechanism to move the double arm in the vertical direction is needed in addition to a mechanism to move the double arm in the horizontal direction.

Japanese Laid-Open Patent H11-87461 is suggested for the substrate carrying apparatus having a mechanism to move in the vertical direction. This substrate carrying apparatus is a telescopic apparatus in which overlapping cylindrical containers moves vertically in the axial direction such that the entire apparatus expands and contracts vertically.

SUMMARY OF INVENTION

Problems to be Solved by Invention

An atmosphere in a room of the substrate processing apparatus is strictly controlled to prevent, for example, attachment of dust to the substrate, to achieve improvement of the yield. Therefore, a carrying room of the substrate processing apparatus is configured as a clean room which performs exhaustion at a position lower than the height where the substrate is carried by downflow from a ceiling. However, operation of each of the various mechanisms inside the carrying room of the substrate processing apparatus produces turbulence. The turbulence causes the dust which has been exhausted to the bottom-side by the stable downflow to swirl upward, such that the dust may attach to the substrate. Although the turbulence calms down as the time elapse, waiting until then causes the reduction of the processing speed. Therefore, it is preferable to minimize the turbulence inside the carrying room of the substrate processing apparatus.

However, for example, in the case of the telescopic substrate carrying apparatus, when the entire apparatus expands and contracts by the movement of the cylindrical container, the inner volume thereof largely changes. Accordingly, the cylindrical container works as if it is a piston, and when the container moves vertically, air is sucked into and is exhausted from a gap between the containers. That is, when the entire apparatus contracts, air is blown out from the interior, and when the entire apparatus expands, air flows into the interior.

Accordingly, when the double arm moves up and down, the large turbulence occurs in the substrate processing apparatus and may cause the dust to attach to the substrate. Also, since the cylindrical container occupies large space in the substrate processing apparatus, the turbulence easily occurs by the movement in the vertical direction and by the movement in the horizontal direction.

The present disclosure is provided to address the above problem, and the objective is to provide a substrate carrying apparatus that can suppress turbulence and reduce attachment of the dust to the substrate.

Means to Solve the Problem

The present disclosure includes:
a carrying arm for carrying a substrate;
a column standing up from a base body with fixed angle;
an upper link which supports the carrying arm at one end, which is rotatably connected to the column, and which moves the carrying arm up and down in accordance with a rotation;
a lower link which is connected to be rotatable around an axis in parallel with a rotation axis of the upper link below a portion of the column connected to the upper link;
a connection link which is rotatably connected to the upper link and the lower link so that the upper link rotates in accordance with a rotation of the lower link; and
a driving unit which rotates the lower link.

Effect of Invention

According to the present disclosure, a substrate carrying apparatus that can suppress the turbulence and that can reduce attachment of the dust to the substrate is provided.

EMBODIMENTS

A substrate carrying apparatus of an embodiment and a substrate processing apparatus adopting the same will be described with the reference to figures.

[Substrate Processing Apparatus]

Figure 1:
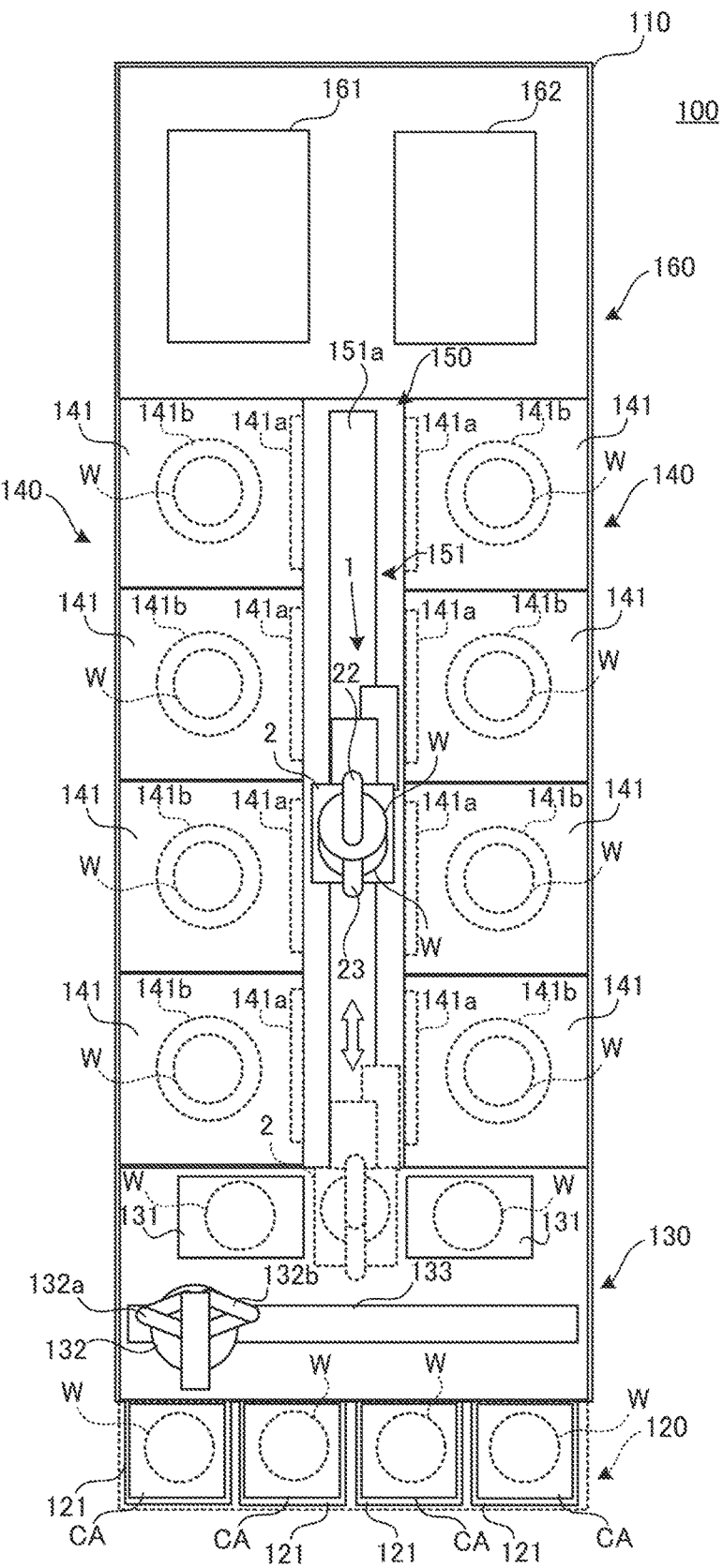
FIG. 1 is a plan view illustrating an entire structure of a substrate processing apparatus adopting a substrate carrying apparatus of an embodiment.
Figure 2:
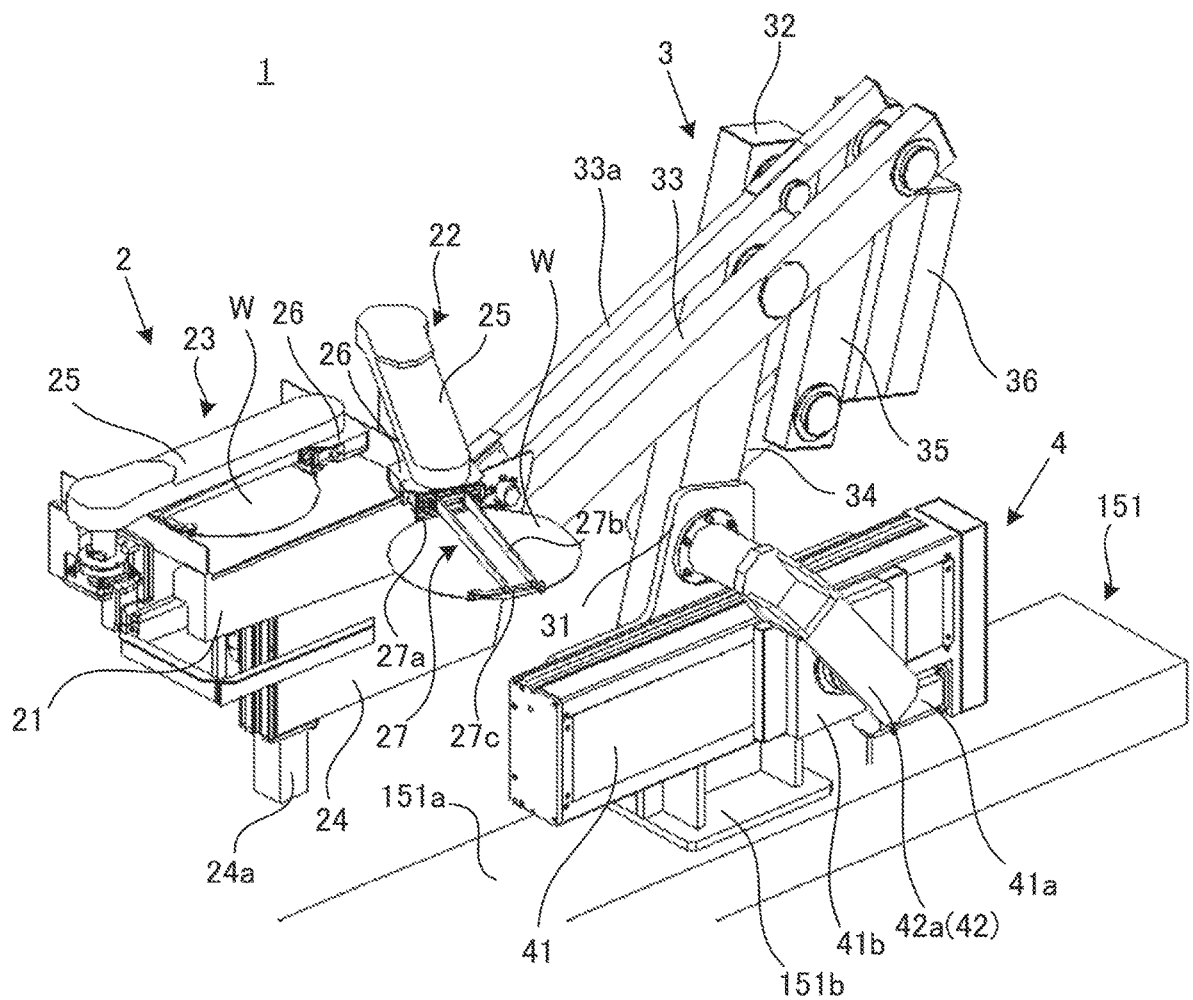
FIG. 2 is perspective view of the substrate carrying apparatus of an embodiment when a carrying arm is at a lower end.

Firstly, an abstract of a substrate processing apparatus 100 adopting a substrate carrying apparatus 1 of the present embodiment will be described with the reference to FIGS. 1 and 2. FIG. 1 is a plan view illustrating an entire structure of the substrate processing apparatus 100. FIG. 2 is perspective view of the substrate carrying apparatus 1. The substrate processing apparatus includes chambers 141, in which a plurality of substrate processing takes place, and is an apparatus to perform single wafer processing to substrates W, which have been housed in a cassette (FOUP) CA during the previous process and have been carried to the chambers 141, inside each chamber 141 one by one. For example, the substrates W are disc-shaped semiconductor wafers. The processing may be, for example, etching, resist peeling, rinsing, and washing. However, the substrates W are not limited thereto and may be various substrates W to which single wafer processing is performed, such as substrates W for display apparatuses.

The substrate processing apparatus 100 includes a cassette loading area 120, a first carrying area 130, a chamber arranging area 140, a second carrying area 150, and a supplementary area 160, all being configured in a cuboid-shape processing room 110.

Note that in the following descriptions, a direction according to gravity is downward, and a direction opposite, that is, against gravity is upward. In the present embodiment, the substrate processing apparatus 100 is arranged on a plane floor surface of factories, for example. Furthermore, a cassette loading area 120-side of the substrate processing apparatus 100 is frontward, and an opposite side is backward. The right and left horizontal direction when viewed from the frontward is the width direction.

(Cassette Loading Area)

The cassette loading area 120 is an area in which a plurality of the cassettes CA is arranged in one line in the width direction along a front surface of the processing room 110. The cassette CA is a casing in which a plurality of the substrates W in the horizontal direction is stacked in a predetermined interval. In general, a FOUP may be used as the cassette CA. An opener 121 to open and close a door of the cassette CA is provided at loading positions for each cassette CA in the cassette loading area 120. The cassette CA is carried into and carried out from where each of the openers 121 is in the cassette loading area 120 by an unillustrated robot running on the ceiling.

(First Carrying Area)

The first carrying area 130 includes a buffer unit 131, a carrying robot 132, and a moving mechanism 133, and is an area in which the substrate W is carried between the cassette CA and the buffer unit 131 by the carrying robot 132 moved by the moving mechanism 133. The first carrying area 130 is formed at the back of the cassette loading area 120.

The buffer unit 131 is a base on which the substrate W is temporally placed. Two buffer units 131 are arranged at the right and left positions with an interval when viewed from the front-side. A plurality of the substrates W in the horizontal direction stacked in a predetermined interval is housed in each of the buffer units 131.

The carrying robot 132 has a double-arm configuration including two arms 132a and 132b each holding the substrate W one by one. The arm 132a is positioned on the lower side in a state holding the substrate W, and the arm 132b is positioned on the upper side in a state holding the substrate W. The carrying robot 132 is provided movably along the arrangement direction of the cassette CA by the moving mechanism 133. For example, a linear guide may be used as the moving mechanism 133.

In the carrying robot 132, the lower arm 132a takes out the unprocessed substrate W from the cassette CA, rotates and moves to the buffer unit 131, and houses the substrate W in the buffer unit 131. Furthermore, the upper arm 132b takes out the processed substrate W from the buffer unit 131, rotates and moves to the cassette CA, and returns the substrate W to the cassette CA. The reason why the lower arm 132a carries the unprocessed substrate W and the upper arm 132b carries the processed substrate W is to prevent components from coming above the processed substrate W and dust from attaching to the processed substrate W.

(Chamber Arranging Area)

The chamber arranging area 140 is an area in which a plurality of the chambers 141 to perform various processing is arranged. Each of the chambers 141 includes an opening 141a that opens and closes by a shutter, and a placing base 141b on which the substrate W to be processed is placed. Note that descriptions about necessary configuration for the processing inside each of the chambers 141, such as a nozzle to apply processing solution to the substrate W, are omitted. Each of the chambers 141 processes one substrate W placed on the placing base 141b.

Furthermore, the chambers 141 are arranged in multiple lines in the front and back direction and in two lines in the width direction, and there is a space between two lines for the second carrying area 150. In addition, when viewed from the front side, the chambers 141 at the left side are vertically arranged in two rows and the chambers 141 at the right side is vertically arranged in three rows (refer FIG. 8). Each of the chambers 141 is arranged in the direction in which the opening 141a faces the second carrying area 150.

(Second Carrying Area)

The second carrying area is an area in which the substrate carrying apparatus 1 of the present embodiment is arranged and the substrate W is carried between the buffer unit 131 and the chamber 141 and between the chambers 141. The substrate carrying apparatus 1 includes a carrying arm 2 having a double-arm configuration including an upper arm 22 and a lower arm 23. The carrying arm 2 carries the unprocessed substrate W out of the buffer unit 131 by the upper arm 22 and carries the processed substrate W into the buffer unit 131 by the lower arm 23. Furthermore, the carrying arm 2 carries the processed substrate W out of the chamber 141 by the lower arm 23 and carries the unprocessed substrate W into the chamber 141 by the upper arm 22.

The substrate carrying apparatus 1 is movably provided between the buffer unit 131 and the chamber 141 by the moving mechanism 151. The moving mechanism 151 is a linear guide having a straight rail 151a and a moving base 151b. The straight rail 151a is a guide rail provided in a bottom of the processing room 110 and extending along the front and back direction. The moving base 151b supports the substrate carrying apparatus and is reciprocally provided in the front and back direction along the straight rail 151a.

(Supplementary Area)

The supplementary area 160 is provided in the back portion of the processing room 110. The supplementary area 160 houses therein a liquid supplying device 161 and a controlling device 162. The liquid supplying device 161 supplies various processing solution, such as etching solution, resist peeling solution, rinsing solution, and washing solution, to the chamber 141. The controlling device 162 is a computer consisting of a calculation device, a storage device, a signal transmission device, and an input and output device, etc. The controlling device 162 controls each component of the substrate processing device 100 by executing substrate processing information and various programs stored in the storage device.

Note that an interior of the processing room 110 of the above substrate processing apparatus 100 is configured as a clean room. That is, although not illustrated, a FFU (Fan Filet Unit) is provided in the ceiling of the processing room 110. A ULPA filter is arranged at the downstream-side of the fan, and the FFU produces downflow which makes air purified via the ULPA filter to flow downward. An exhaustion port dedicated for the first carrying area 130 and the second carrying area 150 is provided in the bottom of the processing room 110. Therefore, air inside the processing room 110 is exhausted from the exhaustion port in the bottom of the processing room together with dust. Furthermore, pressure at the first carrying area 130 and the second carrying area 150 is maintained larger than the outside.

Furthermore, the downflow by the FFU is also produced in the factory in which the processing room is provided, and air inside the factory is exhausted via grating provided on the floor by an exhaustion facility under the floor.

[Substrate Carrying Apparatus]

The details of the substrate carrying apparatus 1 of the present embodiment will be described with the reference to FIGS. 2 to 6. As illustrated in FIG. 2, the substrate carrying apparatus 1 includes the carrying arm 2, a lifting link 3, and a driving unit 4. As described above, the carrying arm 2 interchanges the substrate W between the substrate carrying apparatus 1 and the buffer unit 131 and between the substrate carrying apparatus 1 and the chamber 141. The lifting link 3 moves the carrying arm 2 up and down relative to the height of the chamber 141. The driving unit 4 drives the lifting link 3. In below, each component is described in detail.

(Carrying Arm)

The carrying arm 2 includes a table 21, the upper arm 22, the lower arm 23, and an arm base 24. The table 21 is a base arranged such that a top surface thereof is in the horizontal direction. The substrate W in the horizontal direction fits within an outer edge of the top surface of the table 21. For example, the width of the table 21 is equal to or slightly larger than the diameter of the substrate W. Slightly larger means having a length within several centimeter from the outer edge of the substrate W. Furthermore, the table 21 is held by the lower arm 23 (a wet arm described later) and acts as a water receiver that prevents liquid on the substrate W filled with the liquid from dropping on the moving mechanism 151.

The upper arm 22 and the lower arm 23 are arms to hold the substrate W. The upper arm 22 and the lower arm 23 have common structures and include a driving arm 25, a connection 26, and a holding arm 27. One end of the driving arm 25 is supported by the table 21 rotatably in the horizontal direction with an axis in the vertical direction as the center. The details for the range of rotation, etc., are described later. The driving arm 25 is driven by the unillustrated motor to rotate. The connection 26 is connected to the other arm of the driving arm 25 rotatably in the horizontal direction with an axis in the vertical direction as the center.

The holding arm 27 is attached to the connection 26 and is rotatable in the horizontal direction together with the connection 26. The holding arm 27 includes a movable holder 27a, a beam 27b, and a fixed holder 27c. The movable holder 27a has a pair of claws that comes in contact with and gets away from an edge of the substrate W. The movable holder 27a moves in the direction in which the claw comes in contact with and gets away from the edge of the substrate W by an unillustrated cylinder.

The beam 27b is a pair of bar-shaped member extending to the opposite side from the connection 26 over the substrate W. The fixed holder 27c is fixed to a tip of the beam 27b and has a pair of claws that contacts the edge of the substrate W at the position facing the movable holder 27a. The claws of the movable holder 27a comes to a holding position where the substrate W is held between the claws of the movable holder 27a and the claws of the fixed holder 27c by moving to a position where the claws are in contact with the edge of the substrate W (refer FIG. 7(a)). Furthermore, the claws of the movable holder 27a comes to a release position where the substrate W is released by moving to a position where the claws is away from the substrate W (refer FIG. 7(b))

Furthermore, The upper arm 22 and the lower arm 23 move between a housing position where the substrate W held by the holding arm 27 as described above is within the outer edge of the top surface of the table 21 and a delivering position where the substrate W can be delivered to the outside that is beyond the table in the width direction.

Figure 3:
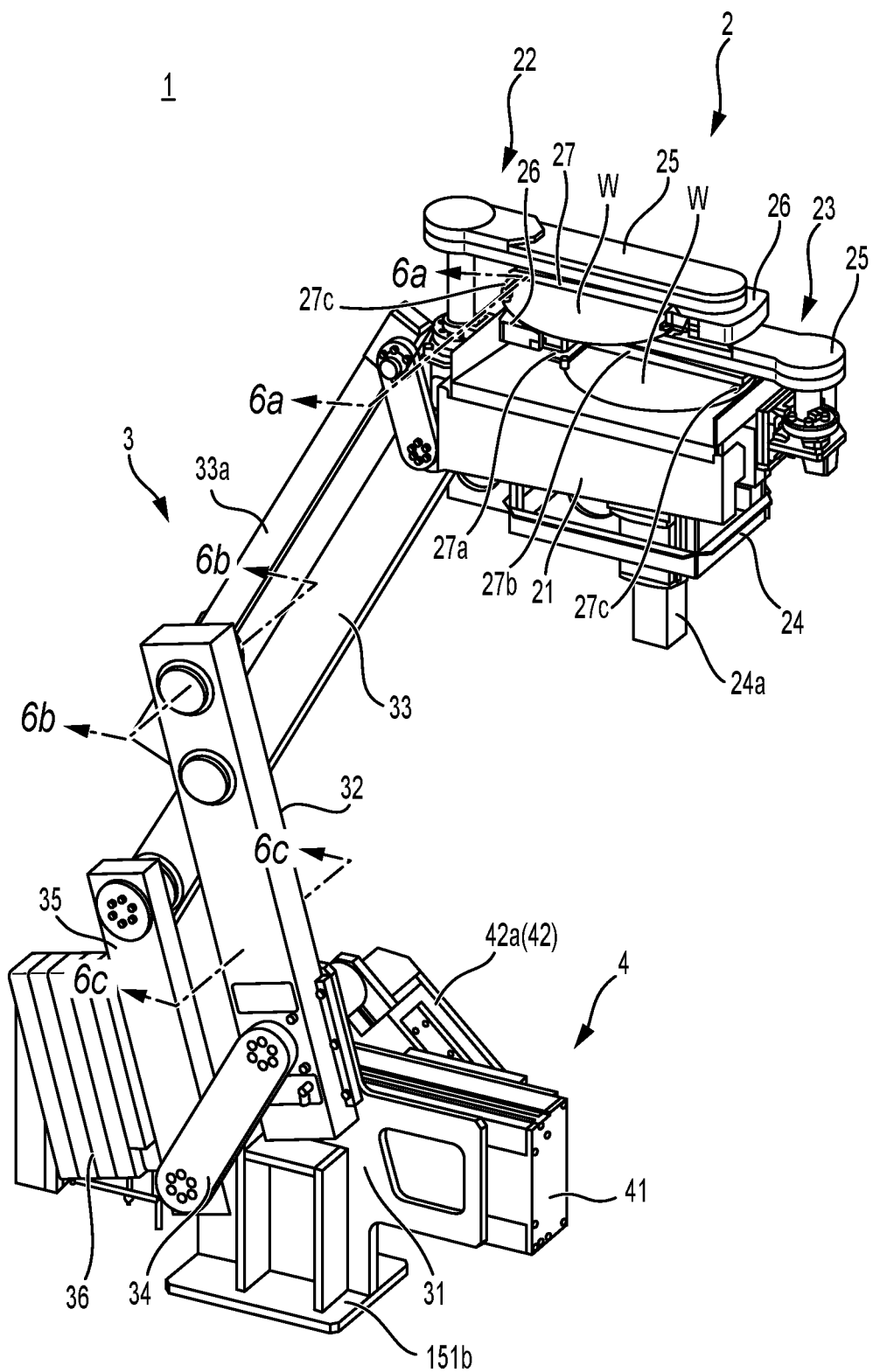
FIG. 3 is perspective view of the substrate carrying apparatus of an embodiment when a carrying arm is at an upper end.

That is, as illustrated in FIGS. 2 and 3, driving axes of the respective driving arms 25 of the upper arm 22 and the lower arm 23 are arranged to the front and back ends of the table 21, that is, the center in the width direction. As illustrated in FIG. 3, when the longitudinal direction of the respective driving arms 25 becomes the front and back direction, the upper arm 22 and the lower arm 23 are vertically overlapped with a space therebetween such that the upper arm 22 is on above and the lower arm 23 is in below, and they do not interfere with each other. At this time, all of the driving arms 25 and the holding arms 27 of the upper arm 22 and the lower arm 23 line up and vertically overlap. By this, the upper arm 22 and the lower arm 23 come to the housing position where the substrate W held by the holding arm 27 is within the outer edge of the table 21 in a plan view.

Note that the upper arm 22 can be used as a carrying arm to carry the processed substrate W, and the lower arm 23 can be used as a carrying arm to carry the unprocessed substrate W. Also, the upper arm 22 can work as a dry arm to carry the substrate W which a surface thereof is dried, and the lower arm 23 can work as a wet arm to carry the substrate W which the surface thereof is filled with liquid. That is, the liquid on the substrate W which was filled with the liquid after processing is prevented from dropping and being deposited on the unprocessed substrate W.

Furthermore, although not illustrated, the driving axis and a pulley on the same axis are fixed inside the driving arm, and a connection axis and a pulley on the same axis are fixed inside the connection 26. A timing belt is bridged across these pulleys. Therefore, when the driving arm 25 at the housing position rotates, the rotation is transferred to the connection 26 via the timing belt, so that the connection 26 and the holding arm 27 rotate together. Accordingly, as illustrated in FIG. 2, the driving arm 25 and the holding arm 27 expand in the width direction and extend linearly such that they no longer overlap with each other, and the substrate W goes beyond the inner side of the outer edge of the table 21 so that it can be delivered to the outside.

Figure 8:
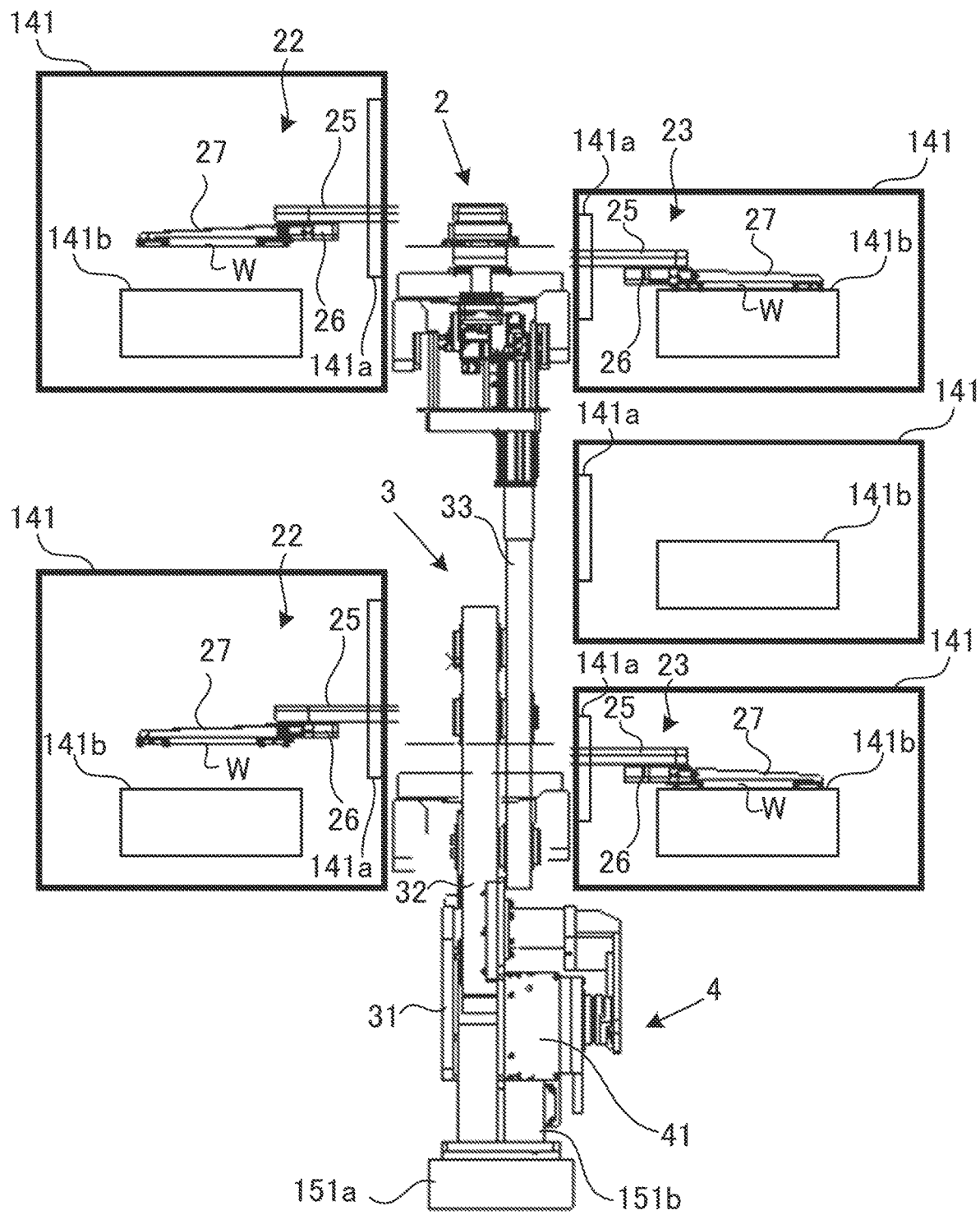
FIG. 8 is a front view illustrating a carrying-in operation of the substrate to a chamber and a carrying-out operation of the substrate from the chamber.
Figure 9:
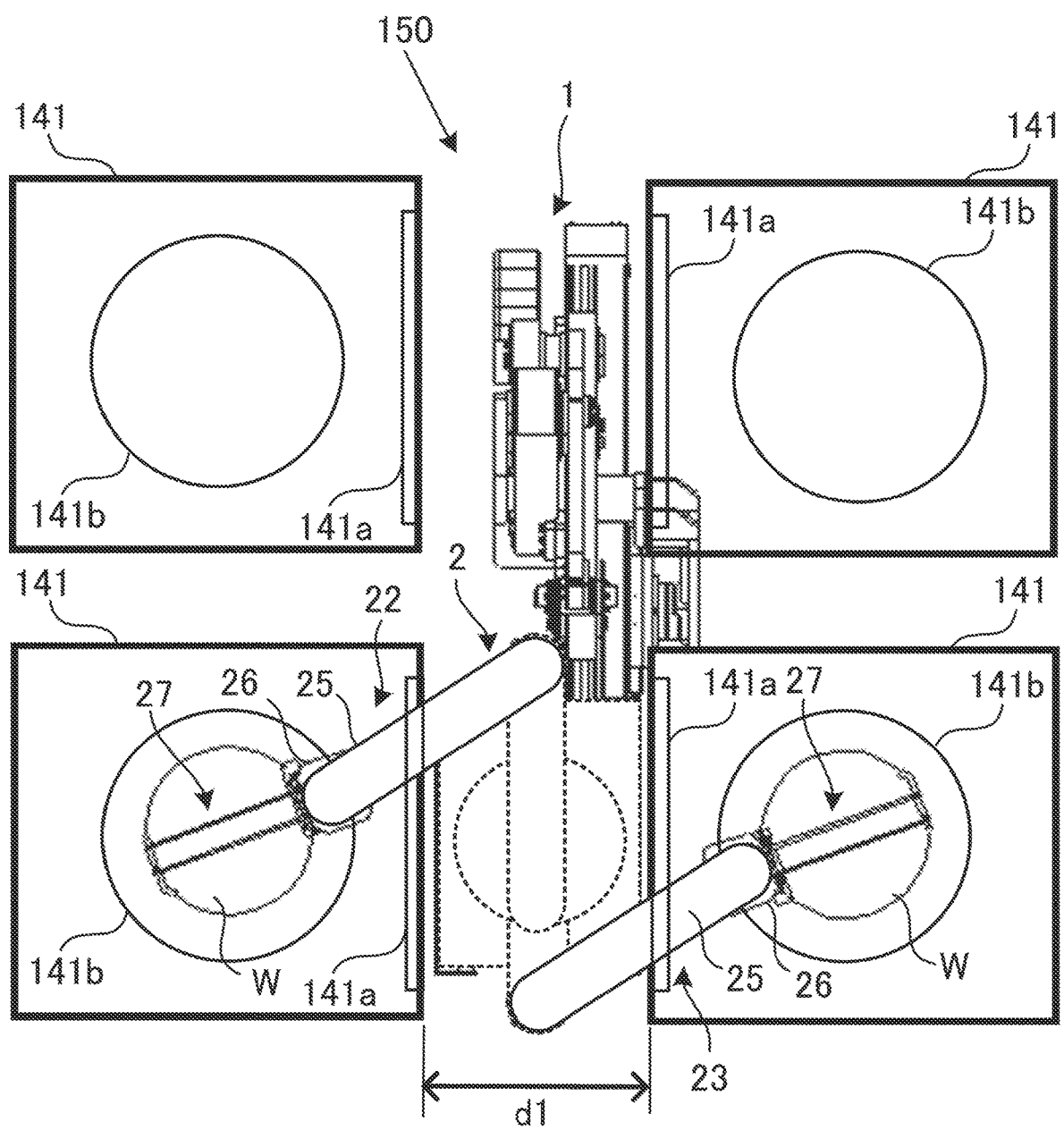
FIG. 9 is a plan view illustrating the carrying-in operation of the substrate to the chamber and the carrying-out operation of the substrate from the chamber.

Note that the upper arm 22 and the lower arm 23 may extend toward both the left and right direction when viewed from frontward by the rotation of the above driving arm 24, and have the delivering position in the two directions of left and right (refer FIGS. 8 and 9). That is, the upper arm 22 and the lower arm 23 have the rotation range of 180° at maximum in the left and right direction with an axis of the driving arm 25 as a center.

The arm base 24 is a member to support the table 21 from below. A lifting mechanism to move the upper arm 22 and the lower arm 23 up and down together is provided to the arm base 24. That is, an upper end of a lifting shaft 24a that is movable in the vertical direction is fixed to the arm base 24, and the upper arm 22, the lower arm 23, and the table 21 are moved up and down by moving the lifting shaft 24a in the vertical direction by the lifting mechanism.

Up and down movement of the arm base 24 is required for descending of the holding arm 27 to place the substrate W and for ascending of the holding arm 27 to lift up the substrate W inside the buffer unit 131 and the chamber 141. Although not illustrated, a cylinder, a gear mechanism, and a ball screw mechanism, etc., may be used as the lifting mechanism.

Note that the operation of the upper arm 22 and the lower arm 23 between the housing position and the delivering position, the operation of the holding arm 27 between the release position and the holding position, and lifting operation of the arm base 24 are controlled by the above controlling device 162.

(Lifting Link)

The lifting link 3 includes a base body 31, a column 32, an upper link 33, a lower link 34, and a connection link 35. The base body 31 is a member to support the entire substrate carrying apparatus 1. The base body 31 is fixed to the moving base 151b or is configure integrally with the moving base 151b. The column 32 of the present embodiment is a prism member standing up in a predetermined angle that was determined beforehand. In the present embodiment, this angle is an angle in which an upper end of the column is slightly inclined backward.

The upper link 33 supports the carrying arm at one end, is movably connected to the column 32, and moves the carrying arm 2 up and down in accordance with the rotation. The axis of rotation of the upper link 33 is in the width direction (refer FIGS. 4 and 5). The upper link 33 is a plate long member which has the width direction longer than the front and back direction. A front end of upper link 33 is rotatably connected to a back end of the arm base 24 of the carrying arm 2. The upper link 33 extends backward beyond the portion connected to the column 32.

Furthermore, an assist link 33a is provided above the upper link 33 in parallel with the upper link 33. The assist link 33a is a plate long member which has the width direction longer than the front and back direction. A front end of the assist link 33a is rotatably connected to the back end of the arm base 24 and a back end of the assist link 33a is rotatably connected to the column 32.

A front end of the lower link 34 is rotatably connected to below the portion of the column 32 connected to the upper link 33 with the axis in parallel with the rotation axis of the upper link 33 as the center. The lower link 34 is a plate long member which has the width direction longer than the front and back direction. The lower link 34 is in parallel with the upper link 33.

Both end of the connection link 35 is rotatably connected to the back ends of the upper link 33 and the lower link 34 so that the upper link 33 rotates in accordance with the rotation of the lower link 34. The connection link 35 is a plate long member which has the width direction longer than the front and back direction.

The column 32, the upper link 33, the lower link 34, and the connection link 35 form a four-bar linkage in which the column 32 is a fixed link, the upper link 33 is a follower, the lower link 34 is a driver, and the connection link 35 is a connector. In the present embodiment, the four-bar linkage formed by the column 32, the upper link 33, the lower link 34, and the connection link 35 is a parallel link in which the distances between facing axes are the same and are in parallel. Furthermore, the column 32, the upper link 33, the assist link 33a, and the arm base 24 form a parallel link.

Figure 4:
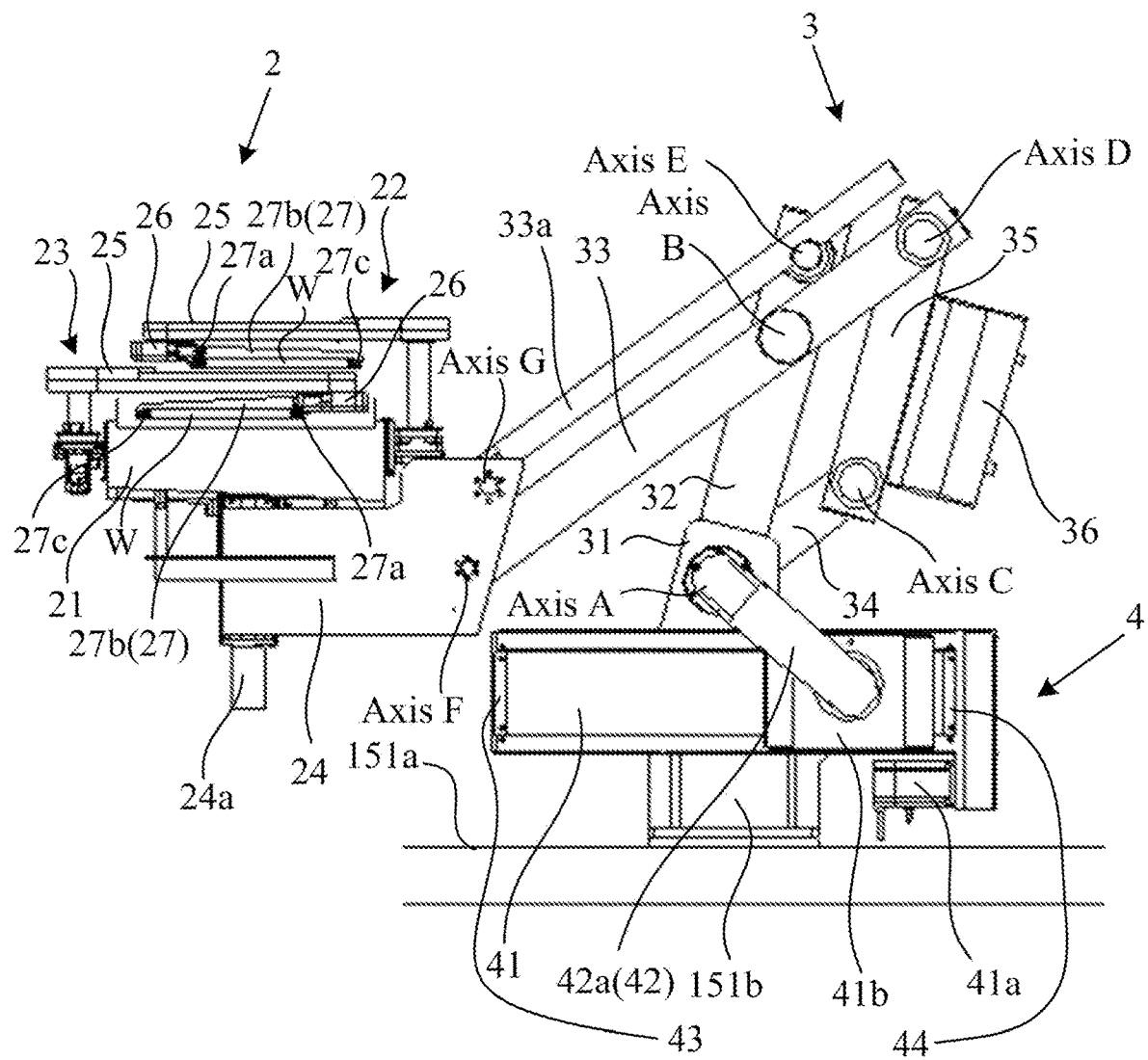
FIG. 4 is perspective view of the substrate carrying apparatus of an embodiment when a carrying arm is at the lower end.
Figure 5:
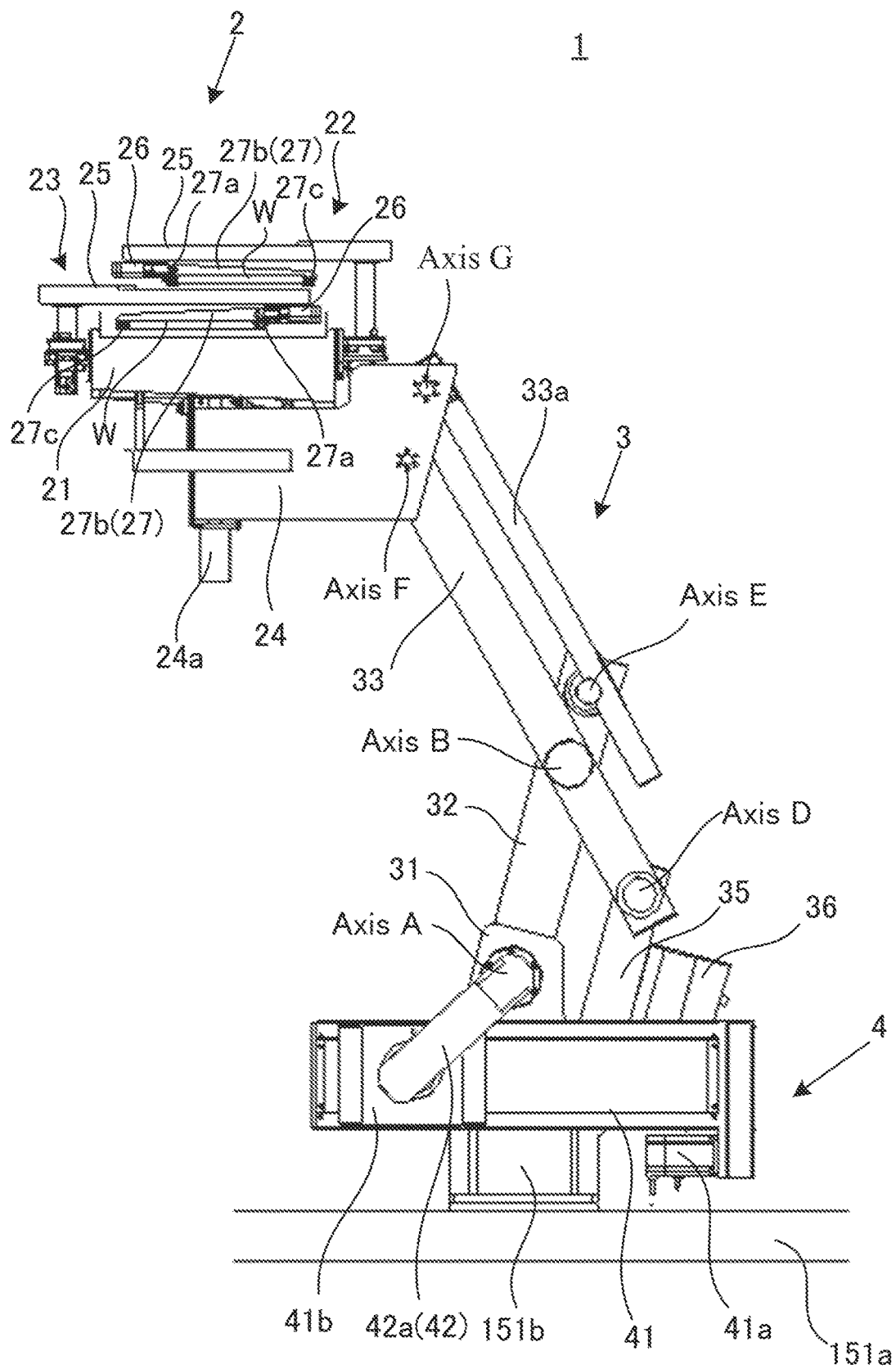
FIG. 5 is perspective view of the substrate carrying apparatus of an embodiment when a carrying arm is at the upper end.

In the following description, as illustrated in FIGS. 4 and 5, an axis of the connection between the lower link 34 that is the driver and the column 32 is an axis A, and an axis of the connection between the upper link 33 that is the follower and the column 32 is an axis B. Furthermore, an axis of the connection between the lower link 34 that is the driver and the connection link 35 is an axis C, and an axis of the connection between the upper link 33 that is the follower and the connection link 35 is an axis D. In addition, an axis of the connection between the column 32 and the assist link 33a is an axis E, an axis of the connection between the upper link 33 and the arm base 24 is shaft F, and an axis of the connection between the assist link 33a and the arm base 24 is an axis G. Note that these axes A to G indicate centers of rotation and do not indicate members. The detailed configuration of the connected portions is described later.

As illustrated in FIGS. 4 and 5, when the lower link 34 rotates around the axis A, the connection link 35 moves up and down while rotating around the axis C, so that the axis D moves up and down. By this, the upper link 33 rotates around the axis B, so that the carrying arm 2 moves up and down. For example, when viewed from the side as illustrated in FIG. 4, when the lower link 34 rotates clockwise, as illustrated in FIG. 5, the carrying arm 2 moves upward. When the lower link 34 rotates counterclockwise from the state in FIG. 5, the carrying arm 2 moves downward.

Even when the upper link 33 rotates and changes the angle thereof, a section between the axes F and G and a section between the axes B and E does not change the angle and maintains the parallel state. Accordingly, the angle of the carrying arm 2 is maintained such that the top surface of the table 21 stays horizontal. Therefore, the substrate W held and carried by the upper arm 22 and the lower arm 23 is always maintained to be horizontal even when the height of the carrying arm 2 changes.

Furthermore, a spindle 36 is provided to the connection link 35. It is preferable to select the weight of the spindle 36 to balance with the carrying arm 2 when the fulcrum therebetween is the axis B. By this, force required to move from one end to the other end at the time of initiation is reduced.

Figure 6A:
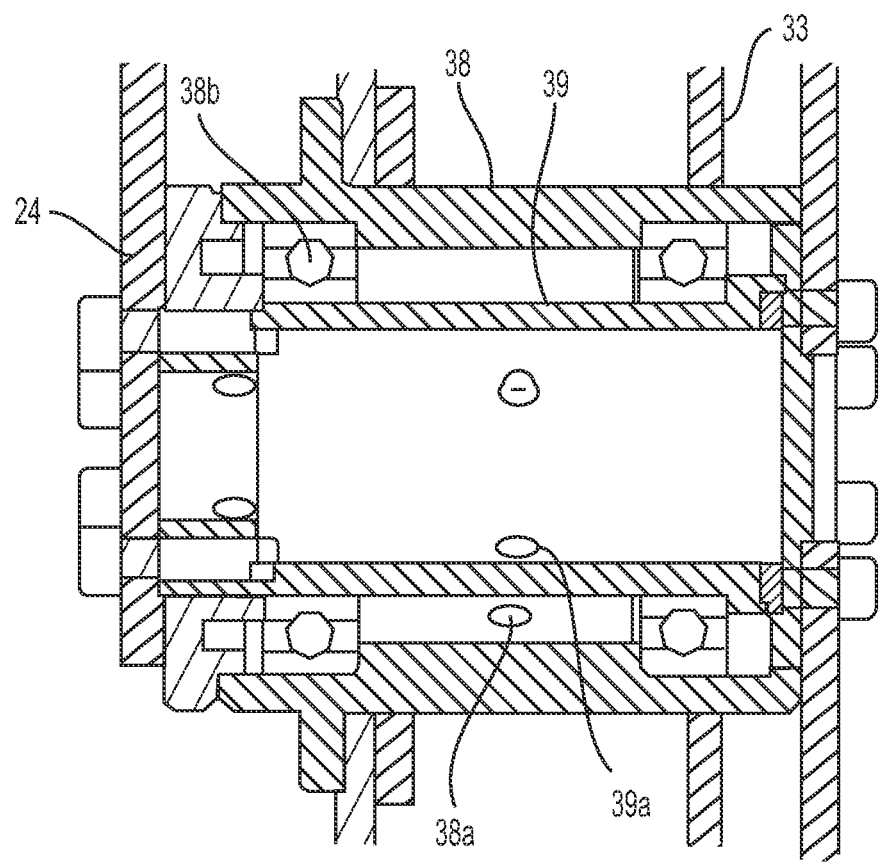
FIG. 6(a) is a cross-sectional view taken along cross-sectional cut dines 6a-6a, of FIG. 3.
Figure 6B:
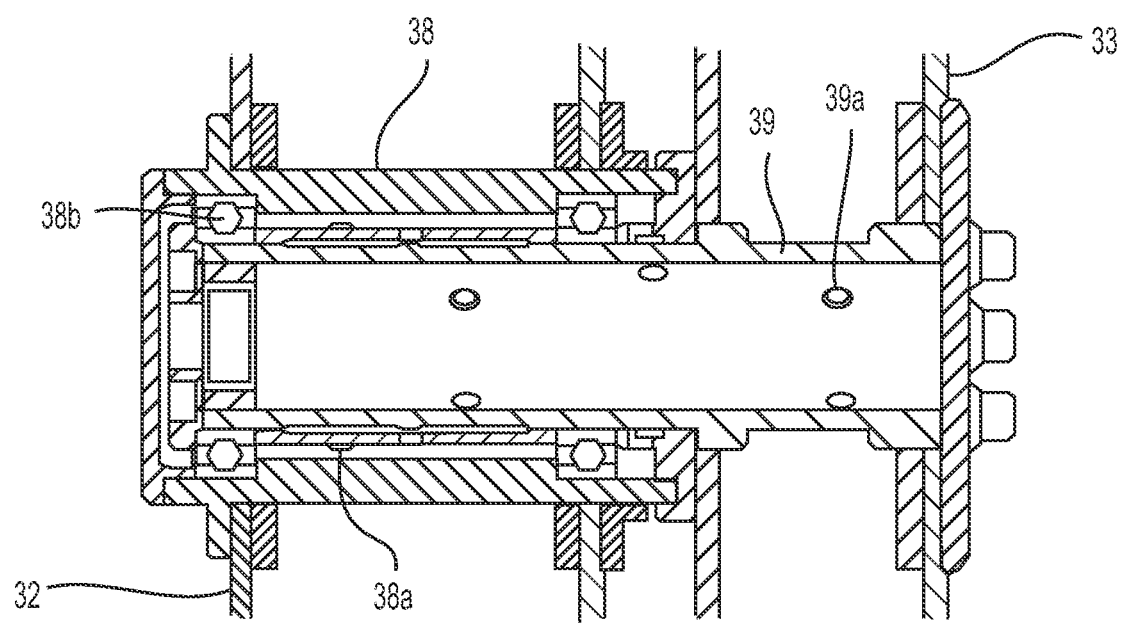
FIG. 6(b) is a cross-sectional view taken along cross-sectional cut lines 6b-6b of FIG. 3.
Figure 6C:
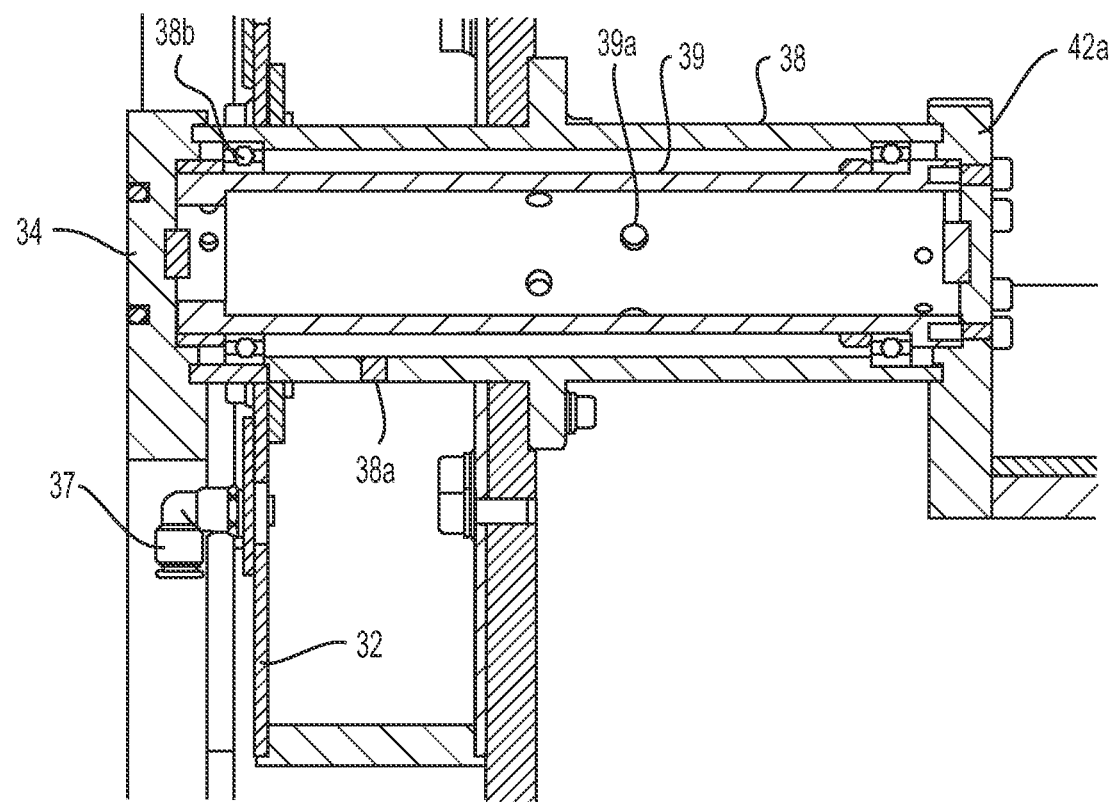
FIG. 6(c) is a cross-sectional view taken along cross-sectional cut lines 6c-6c of FIG. 3.

Furthermore, as illustrated in FIGS. 6(a), 6(b), and 6(c) that are cross-sectional views of FIG. 3 cut along cross-sectional cut lines 6a-6a, 6b-6b and 6c-6c, respectively, the interior of the above lifting link 3 is communicated to make air flow. In addition, an exhaustion port 37 to exhaust air from below, that is, from the driving unit 4-side is provided to the lift link 3.

In detail, the column 32, the upper link 33, the lower link 34, the connection link 35, and the assist link 33a are hollow rectangular tubes. Furthermore, a connected portion where these rectangular tubes are connected to achieve the rotation around the axes A to G is formed by inserting a hollow inner tube 39 fixed to one of the targets to be connected together in a hollow outer tube 38 fixed to the other of the targets to be connected together via a bearing 38b. A plurality of ventilation holes 38a and 38b communicated to the interior of the column 32, the upper link 33, the lower link 34, the connection link 35, and the assist link 33a is formed to each of the outer tube 38 and the inner tube 39. In addition, space in the connected portion between each rectangular tubes and the outer tube 38 and inner tube 39 has a labyrinth structure in which paths inside are curved by steps and recesses and is communicate to the outside.

The exhaustion port 37 is provided below the axis B in the column 32 and communicates with the interior of the column 32. Although not illustrated, the exhaustion port 37 is connected to an exhaustion device for exhaustion via a flexible pipe.

(Driving Unit)

As illustrated in FIGS. 2, 4, and 5, the driving unit 4 includes a linear motion mechanism 41 and a conversion unit 42. The linear motion mechanism 41 a mechanism that having a linear motion unit 41b that is driven by a driving source and that linearly reciprocate along the direction orthogonal to the rotation axes of the upper link 33 and the lower link 34. Note that the driving unit 4 is arranged at a position lower than the opening of the chamber 141 to perform processing to the substrate W (refer FIG. 8).

The linear motion mechanism 41 of the present embodiment is a linear guide fixed to the base body 31. That is, the linear motion mechanism 41 includes and is formed by a motor that is the driving source 41a, a ball screw, a nut, a guide rail, and a slider. The ball screw and the guide rail are provided in the front and back direction, and the nut is screwed to a screw shaft. The slider is fixed to the nut and moves along the guide rail extending in the front and back direction by axially rotating the screw shaft by a servo motor, so that the slider linearly moves in the front and back direction. This slider is the linear motion unit 41b. Note that the servo motor transfers the rotation of the shaft having the axis in the front and back direction to the ball screw by the belt.

Note that, as described above, since force required to move from a moving end of the linear motion unit 41b at the time of initiation is reduced by the spindle 36 provided to the connection link 35, force required for the motor can be little. Therefore, the driving source 41a can be downsized, and production of dust can be reduced.

As illustrated FIG. 4, the driving source 41a is arranged at a side distal from the carrying arm 2, that is, at the back end-side among a pair of the moving ends 43, 44 of the linear motion unit 41b. Furthermore, when the carrying arm 2 at the lower moving end, the linear motion unit 41b is at the moving end 44 distal from the carrying arm 2, that is, the back end. In addition, the driving source 41a is arranged at the arrangement surface side of the linear motion mechanism 41, that is, below the linear motion mechanism 41.

The conversion unit 42 connects the linear motion unit 41b and the lower link 34 and converts the movement of the linear motion unit 41b to the rotation of the lower link 34. The conversion unit 42 of the present embodiment is a L-shaped swing arm 42a (refer FIG. 2). A lower end of the swing arm 42a is rotatably connected to linear motion unit 41b, and an upper end of the swing arm 42a is provided over the linear motion mechanism 41 and is connected to the connection between the column 32 and the lower link 34. The lower end of the swing arm 42a is provided to be rotatable with the axis A as a center in accordance with the linear movement of the linear motion unit 41b.

However, the swing arm 42a is provided to be telescopic relative to the linear motion unit 41b in the radial direction of the rotation at the connection between the swing arm 42a and the linear motion unit 41b. Therefore, the swing arm 42a can rotate while the linear motion unit 41b is moving linearly. Note that a structure in which the swing arm 42a does not extend and contract and the axis in the connection between the swing arm 42a and the linear motion unit 41b vertically moves along the swing arm 42a may be employed. By this, the distance from the connection between the swing arm 42a and the linear motion unit 41b to the axis A becomes longer as the swing arm 42a gets closer to the pair of the moving ends 43, 44 of the linear motion unit 41b and becomes shorter as the swing arm 42a gets close to the center between the pair of the moving ends 43, 44. That is, the rotation radius becomes longer as the swing arm 2 gets closer to the moving end 44 of the linear motion unit 41h and becomes shorter as the swing arm 2 gets close to the center.

According to the above-described linear motion mechanism 41, as illustrated in FIG. 4, when the linear motion unit 41b is moved to the back end, the carrying arm 2 moves down. As illustrated in FIG. 5, when the linear motion unit 41b is moved to the front end, the carrying arm 2 moves up. Therefore, the height of the carrying arm 2 can be determined by moving the linear motion unit 41b to either of the front end and the back end.

Note that activation, termination, speed, and operation timing, etc., of the driving source of the driving unit 4 is controlled by the above controlling device 162. That is, the height of the carrying arm 2 and the speed of moving up and down are controlled by the controlling unit 162.

[Operation]

An operation of the above substrate processing apparatus 100 and the substrate carrying apparatus 1 is described.

(Lifting Operation of Carrying Arm)

Firstly, an operation of moving the carrying arm up and down to match the height of the upper arm 22 and the lower arm 23 to the height of the opening of the chamber 141 will be described in below. As illustrated in FIG. 4, when the carrying arm 2 is at the lowest end, the linear motion unit 41b is at the back end.

From this state, when the driving source 41a is operated to move the linear motion unit 41b forward, the swing arm 42a rotates forward, and the lower link 34 rotates around the axis A so that it moves down. Then, since the axis D of the back end of the upper link 33 moves down while the connection link 35 connected to the lower link 34 by the axis C, the upper link 33 rotates around the axis B, and the carrying arm 2 of the front end of the upper link 33 moves up. When the linear motion unit 41b reaches the front end, the carrying arm 2 comes to the upper moving end, as illustrated in FIG. 5.

Next, when the driving source 41a is operated in the reverse direction to move the linear motion unit 41b backward, the swing arm 42a rotates backward, and the lower link 34 rotates around the axis A so that it moves up. Then, since the axis D of the back end of the upper link 33 moves up while the connection link 35 connected to the lower link 34 by the axis C, the upper link 33 rotates around the axis B, and the carrying arm 2 of the front end of the upper link 33 moves down. When the linear motion unit 41b reaches the back end, the carrying arm 2 comes to the lower moving end, as illustrated in FIG. 4.

The top surface of the table 21 and the upper arm 22 and the lower arm 23 are maintained in the horizontal state by the parallel link including the assist link 33a while the carrying arm 2 is moving between the upper and lower moving ends. Furthermore, as described above, when the linear motion unit 41b gets close to the front and back moving ends, since the rotation of the conversion unit 42 becomes slower, the speed of moving up and down becomes slower. Therefore, when matching the positions of the arms and the opening of the chamber 141, the speed gets slower without adjustment such that the movement the movement becomes slow which is preferable for matching the positions.

(Exhaustion Operation)

During the above lifting operation, exhaustion by the exhaustion device connected to the exhaustion port 37 is performed. That is, air inside the column 32, the upper link 33, the lower link 34, the connection link 35, the assist link 33a, the outer tube 38, and the inner tube 39 communicated via the ventilation port 38a and 39a is exhausted from the exhaustion port 37 at the lower side. By this, dust produced from the operating portions does not flow into the interior of the substrate processing apparatus 100 and is exhausted to the outside. Since air inside the substrate processing apparatus 100 flows in via slight gap forming the labyrinth structure in the plurality of the connections, air would not be concentratedly sucked in from one large opening, and the turbulence would be small.

(Delivering Operation of Substrate)

Next, the operation to deliver the substrate W between the buffer unit 131 and the chamber 141 by the substrate carrying apparatus 1 will be described. Firstly, as described for the substrate processing apparatus 100, the unprocessed substrate W taken out from the cassette CA by the carrying robot 132 is housed in the buffer unit 131. Furthermore, the lower arm 23 of the substrate carrying apparatus 1 holds the processed substrate W in the chamber 141.

Figure 7A:
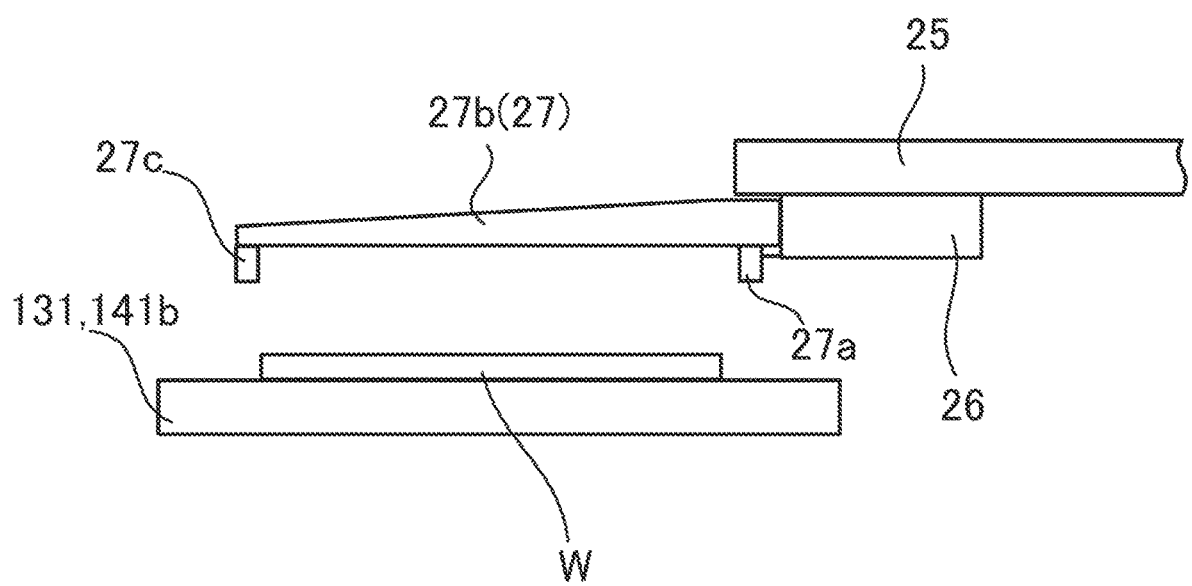
FIGS. 7(a) to 7(d) are diagrams describing an operation of holding arm.

As illustrated in FIG. 1, the substrate carrying apparatus 1 is moved forward by the moving mechanism 151 and the carrying arm 2 comes to the side of the buffer unit 131. The height of the lower arm 23 is matched to the height of the unprocessed substrate W housed in the buffer unit 131. The lower arm 23 is changed from the housing position to the delivering position, and as illustrated in FIG. 7(a), the holding arm 27 is moved above the unprocessed substrate W in the buffer unit 131.

Figure 7B:
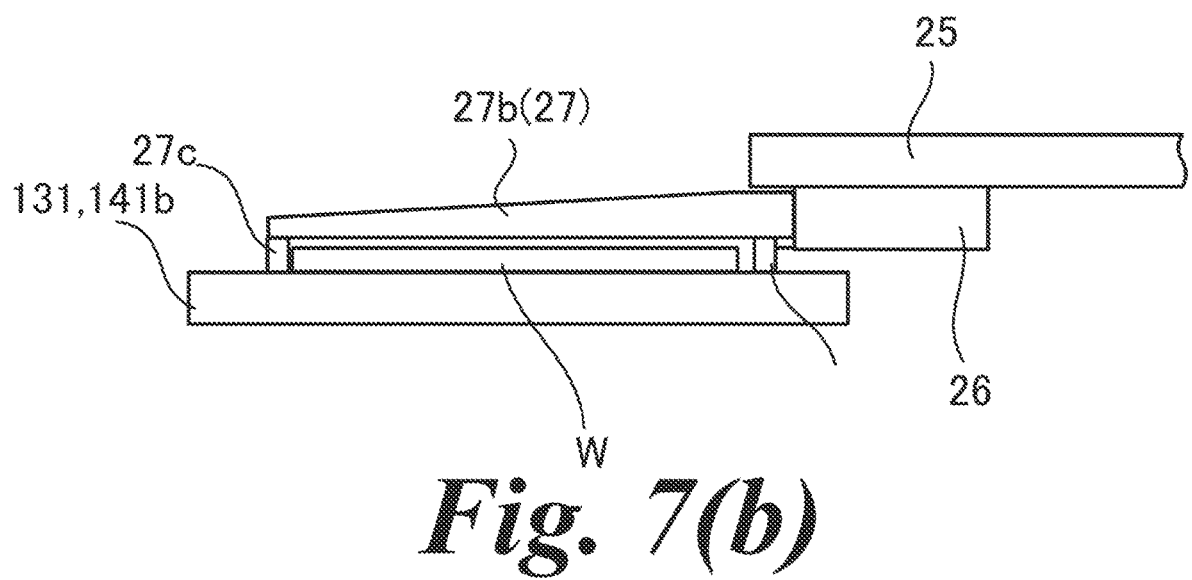
Figure 7C:
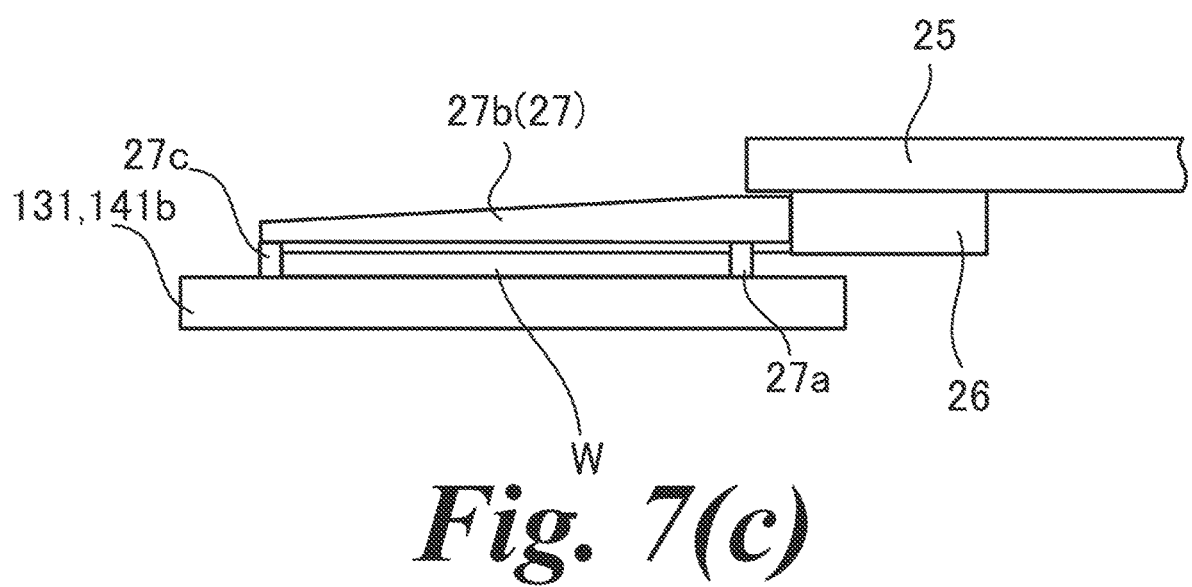
Figure 7D:
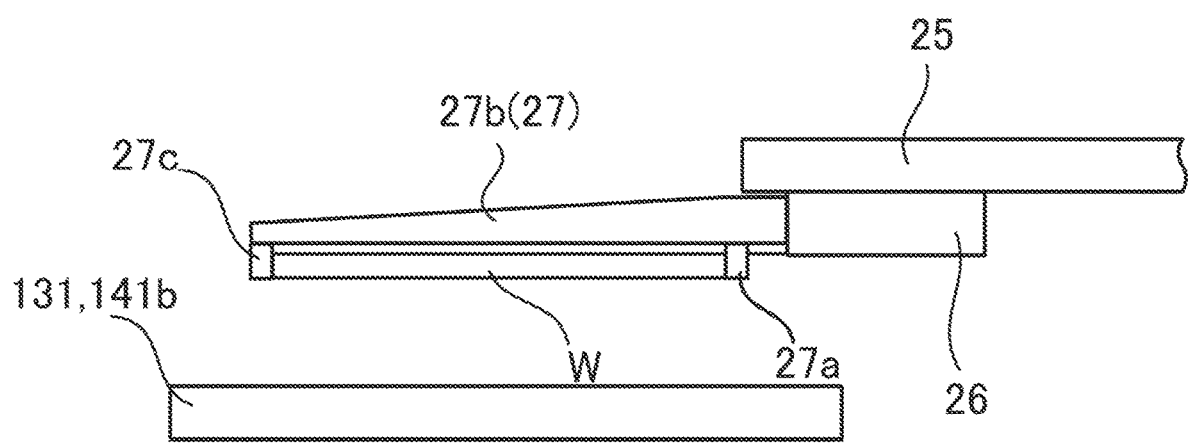

When the lifting shaft 24a moves down, the holding arm 27 having the movable holder 27a at the release position moves down, and as illustrated in FIG. 7(b), the substrate W enters between the movable holder 27a and the fixed holder 27c. In this state, as illustrated in FIG. 7(c), the movable holder 27a moves to the holding position so that the edge of the substrate W is held by the claw of the movable holder 27a and the claw of the fixed holder 27c. Then, as illustrated in FIG. 7(d), the lifting shaft 24a moves up, and the lower arm 23 returns to the housing position.

Furthermore, the driving unit 4 matches the height of the upper arm 22 to a vacant position in the buffer unit 131. Then, the upper arm 22 is changed from the housing position to the delivering position, and as illustrated in FIG. 7(d), the upper arm 22 moves the processed substrate W held thereby to the vacant position in the buffer unit 131. As illustrated in FIG. 7(c), the lifting shaft 24b is moved down to move down the holding arm 27, and as illustrated in FIG. 7(b), the movable holder 27a moves to the release position so that the substrate W is released. Then, as illustrated in FIG. 7(a), the lifting shaft 24a moves up, and the upper arm 22 returns to the housing position.

Next, as illustrated in FIGS. 8 and 9, the substrate carrying apparatus 1 is moved backward by the moving mechanism 151, and the carrying arm 2 comes to the side of the chamber 141 to perform the processing. By the driving unit 4, as illustrated in FIG. 8, the height of the upper arm 22 is matched to the opening 141a of the chamber 141, and as illustrated in FIG. 9, the upper arm 23 is changed from the housing position to the delivering position so that the holding arm 27 is inserted into the chamber 141 from the opening 141a. Note that although FIG. 8 indicates all state in which the holding arm 27 is inserted into the upper chamber 141 and the lower chamber 141, in practice, up to two holding arms 27 may be inserted at most. Then, as illustrated in FIG. 7(a), the holding arm 27 comes to above the processed substrate W. Afterward, as illustrated in FIGS. 7(b) to 7(d), the holding arm 27 holding the substrate W moves up, and the upper arm 22 returns to the housing position.

Furthermore, the driving unit 4 matches the height of the lower arm 23 to the opening 141a of the chamber 141. Then, the lower arm 23 is changed from the housing position to the delivering position, and as illustrated in FIG. 7(d), the lower arm 23 moves the unprocessed substrate W held thereby in the chamber 141. Afterward, as illustrated in FIGS. 7(c) to 7(a), the holding arm 27 moves down, and by moving the movable holder 27a to the release position, the substrate W is placed on the placing base 141b, and then, the holding arm 27 moves up, and the lower arm 23 returns to the housing position.

Furthermore, the substrate carrying apparatus may, after carrying out the substrate W processed in the chamber 141 from the chamber 141, carry the substrate W in the other chamber 141 to perform other processing. For example, after washing processing is performed in one chamber 141, drying processing may be performed in the other chamber 141. In this case, the upper arm 22 can be used as a dry arm, and the lower arm 23 can be used as a wet arm. For example, the lower arm 23 that is a wet arm may carry the substrate W filled with liquid into the chamber 141 to perform drying, and the upper arm 22 that is a dry arm may carry the substrate W to which the drying processing have been performed. Furthermore, in the substrate carrying apparatus 1, since the upper arm 22 and the lower arm 23 respectively has the delivering positions in the two directions of right and left, the processing can be performed sequentially by carrying the substrate W which has been processed in one chamber 141 out and into the facing other chamber 141.

[Effect]

(1) The substrate carrying apparatus 1 of the present embodiment includes a carrying arm 2 for carrying a substrate, a column 32 standing up from a base body 31 with fixed angle, an upper link 33 which supports the carrying arm 2 at one end, which is rotatably connected to the column 32, and which moves the carrying arm 2 up and down in accordance with a rotation, a lower link 34 which is connected to be rotatable around an axis in parallel with a rotation axis of the upper link 33 below a portion of the column 32 connected to the upper link 33, a connection link 35 which is rotatably connected to the upper link 33 and the lower link 34 so that the upper link 33 rotates in accordance with a rotation of the lower link 34, and a driving unit 4 which rotates the lower link 34.

Although the driving unit 4 may produce dust, in the present embodiment, the driving unit 4 is arranged at the lower side, and operation portions to move the carrying arm 2 up and down are only arranged at the upper side, which are the four-bar mechanism. Therefore, suction and exhaustion from the gap between the tubular containers are not produced every time of lifting, unlike the telescopic substrate carrying apparatus. Accordingly, the attachment of dust to the substrate W by the turbulence of downflow can be reduced. For example, as described above, the turbulence of rotation can be further reduced by forming each links by the plate long member which has the width direction longer than the front and back direction.

Furthermore, since only one driving unit 4 for moving the carrying arm up and down is provided at the lower side, production of dust is reduced even when compared with a case in which motors that produce dust are provided and driven for each rotating axis. That is, when the motors are provided for each axis, the amount of the produced dust becomes larger because the number of motors becomes large. In addition, when the motors are provided near the substrate W and the opening 141a of the chamber 141, a possibility for dust to attach to the substrate W increase. Moreover, since the motor is heavy, the body is required be significantly thick to have rigidity enough to support the motors provided on the upper axis, while the motors provided on the lower axis needs to have larger output, which is heavier. Accordingly, the amount of the produced dust increases. In the present embodiment, the number of the driving source 41a can be reduced and the required output can be small, so that the production of dust can be suppressed.

Furthermore, since a four-bar linkage in which the axes of the rotation of the upper link 33 and the lower link 34 are parallel to each other is employed, the required space in the width direction can be reduced. For example, in a case of the telescopic substrate carrying apparatus, a cylindrical container having a double arm on a top portion occupies a space from top to bottom. In addition, in a case of providing motors for each rotating axis, since the body must be thick and the motor at the lower side must be large as described above, an entire space required becomes large. In the present embodiment, since the four-bar linage can be formed by thin members forming sections, the required space can be reduced. For example, as described above, by forming each link by thin member which has the width direction longer than the front and back direction, the space required in the width direction can be reduced.

(2) The driving unit 4 includes a linear motion mechanism 41 having a linear motion unit 41b which is driven by a driving source 41a and linearly reciprocates along the horizontal direction orthogonal to the rotation axes of the upper link 33 and the lower link 34, and a conversion unit 42 which connects the linear motion unit 41b and the lower link 34 and converts a movement of the linear motion unit 41b to the rotation of the lower link 34.

By this, since the driving source 41a that is the production source of dust is arranged at the lower side and the linear motion unit 41b moves in the horizontal direction, dust directed upward is hardly produced. Therefore, the attachment of dust to the substrate W can be reduced. Also, since dust produced by the movement of the linear motion unit 41b is directed downward in the horizontal direction, effects to the upper side can be suppressed. In addition, by setting the movement direction of the linear motion unit 41b to be a direction orthogonal to the axes of the upper link 33 and the lower link 34, a space in the width direction in parallel with the axis can be reduced. Moreover, since the height of the carrying arm can be adjusted by only controlling the linear position of the linear motion unit 41b, the control can be facilitated.

(3) The driving source 41b is arranged in a moving end 44 at a side distal from the carrying arm 2 among a pair of the moving ends 43, 43 of the linear motion unit 41b. Although the driving source 41a may be the largest production source of dust, since it is distal from the carrying arm 2, the attachment of dust to the substrate W can be reduced.

(4) When the carrying arm is in a lower moving end, the linear motion unit 41b is in the moving end 44 at the side distal from the carrying arm 2. Therefore, it would be hard for the carrying arm 2 to be affected by dust produce by the movement of the linear motion unit 41b, and the attachment of dust to the substrate W can be reduced.

(5) An interior of the lifting link 3 which includes and is configured by the column 32, the upper link 33, the lower link 34, the connection link 35, and the connection portions therebetween are communicated with each other so that the air can pass therethrough, and the interior of the lifting link 3 includes an exhaustion port to exhaust air from a driving unit 4-side. Therefore, dust produced from the movable portion in the lifting link 3 can be exhausted from inside, and the attachment of dust to the substrate W can be reduced.

(6) The driving unit 4 is arranged at a position lower than the opening of the chamber 141 to perform processing to the substrate W. Therefore, the attachment of dust to the substrate W that is carried in and out relative to the chamber 141 can be reduced.

(7) The driving unit 4 drives the linear motion unit by single driving source 41b. Therefore, a number of the driving source 41b to move the carrying arm 2 up and down can be reduced and a number of causes that produce dust can be reduced, so that the attachment of dust to the substrate W can be reduced.

(8) The carrying arm 2 is rotatably provided in the horizontal direction and includes a pair of an upper arm 22 and a lower arm 23 housed at positions that overlap with each other. Therefore, the space in the width direction can be reduced, and production of dust by turbulence at the time of moving the carrying arm 2 up and down can be reduced. In addition, since the width of the carrying arm 2 may be arbitrary as long as the substrate W fit in the space, the carrying space along the arrangement direction of the chamber 141 for the substrate carrying apparatus 1 to move can be small.

Figure 10:
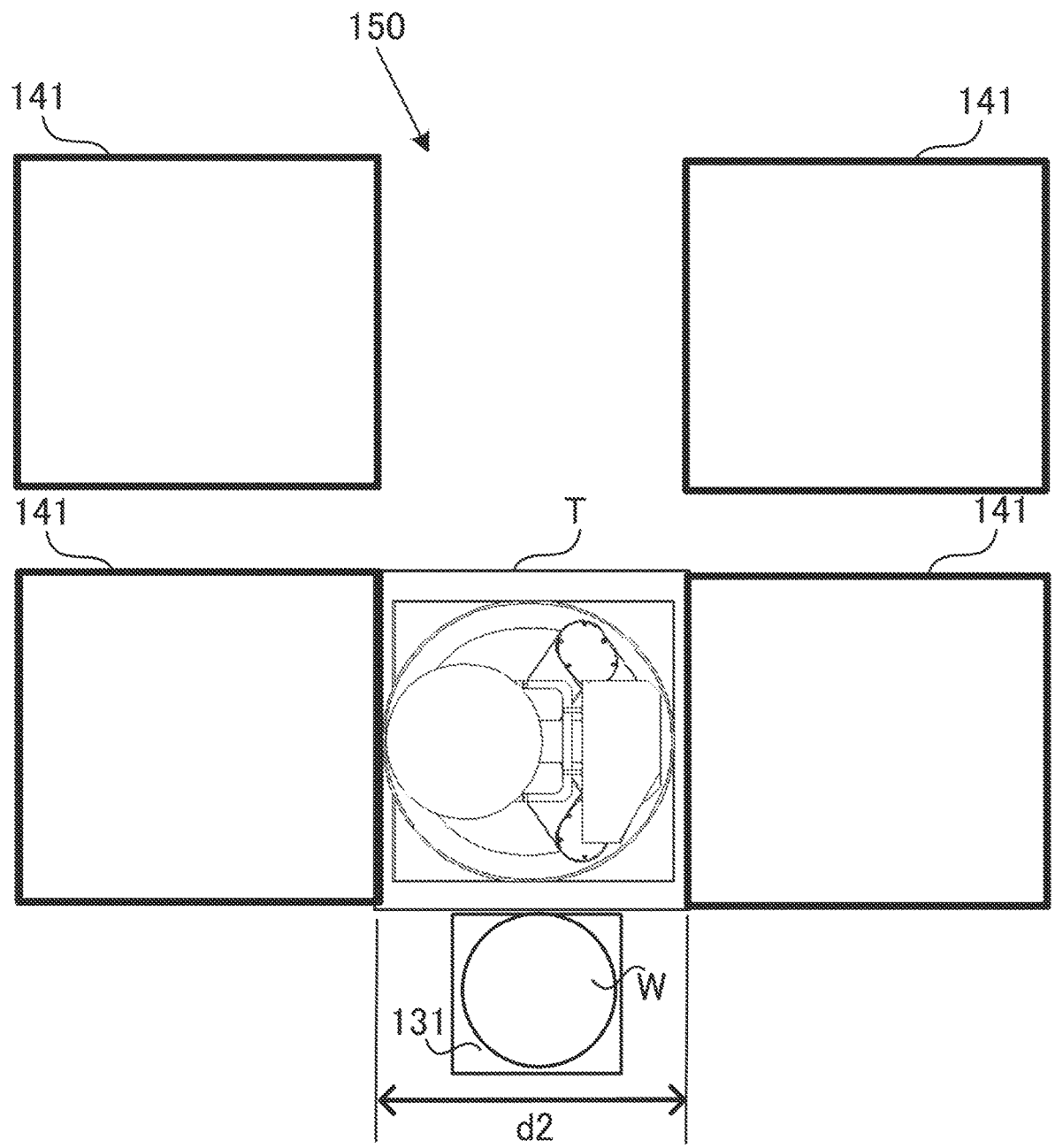
FIG. 10 is a plan view illustrating an example of a swing arm.

For example, in the present embodiment, by moving the upper arm 22 and the lower arm 23 by 180°, the substrate W can be delivered between the facing chambers 141 without a space to rotate the loading portion of the upper arm 22 and the lower arm 23 in the horizontal direction. Therefore, it is not necessary to rotate the carrying arm 2, and as illustrated in d1 of FIG. 9, a second carrying area 150 may be small. In contrast, in a case of a double-arm substrate carrying apparatus T illustrated in FIG. 10, in a case of delivering the substrate W between the facing chambers 141, the entire portion in which the double-arm is arranged have to be rotated. Therefore, as illustrated in d2, the width of the second carrying area becomes large.

(Other Embodiment)

The present disclosure is not limited to the above embodiments and includes other embodiments described below. Furthermore, the present disclosure includes combinations of all or any of the above and other embodiments below. In addition, various omissions, replacements, and changes may be made to these embodiments without departing from the scope of claims, and modifications thereof are included in the present disclosure.

Figure 11:
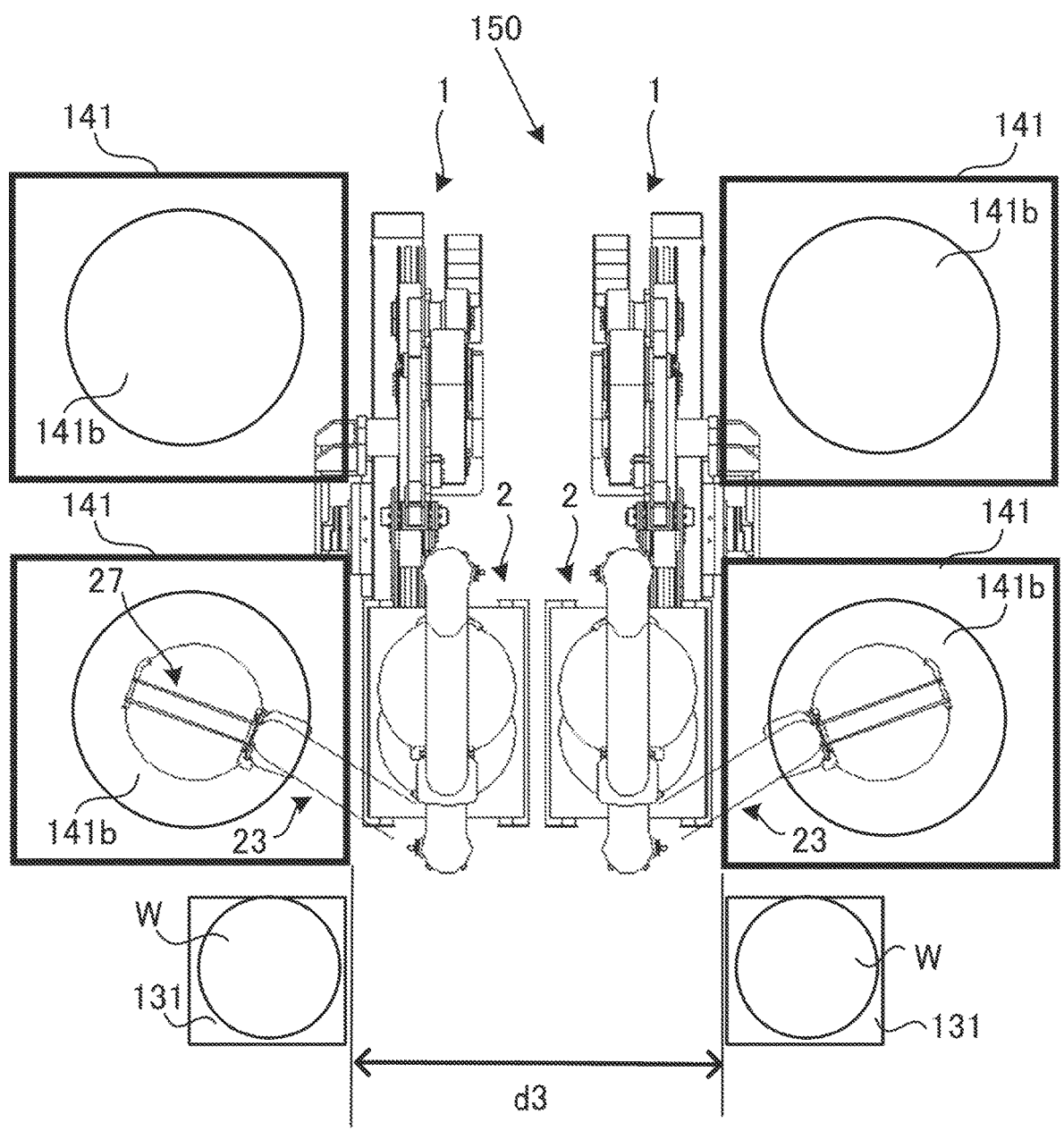
FIG. 11 is a plan view illustrating an aspect in which two lines of the substrate carrying apparatuses are provided.

For example, as described above, since the space of the second carrying area 150 in the width direction can be made small, as illustrated in FIG. 11, enlargement of width indicated in d3 may be small even when the substrate carrying apparatuses 1 are arranged in two lines. In this case, the substrate carrying apparatuses 1 in each row delivers the substrate W between chambers 141 in adjacent rows.

Furthermore, the linear motion mechanism 41 may be formed by a linear motor. That is, the driving source 41a may be linear motor, and the linear motion unit 41b may be a slider that linearly moves by linear motor. By this, since sliding portions can be reduced, production of dust can be further reduced. In addition, by performing exhaustion for the movable portion of the carrying arm 2, flowing out of dust into the substrate processing apparatus 100 can be prevented. Note that the carrying arm 2 are not limited to the above aspects as long as the carrying arm 2 can hold, carry, and release the substrate W. A number of arms may be one or more.

What is claimed is:

1. A substrate carrying apparatus comprising:
   a carrying arm for carrying a substrate;
   a column standing up from a base body at a fixed angle with respect to the base body;
   an upper link which supports the carrying arm at one end, which is rotatably connected to the column, and which moves the carrying arm up and down in accordance with a rotation;
   a lower link which is connected to be rotatable around an axis in parallel with a rotation axis of the upper link below a portion of the column connected to the upper link;
   a connection link which is directly rotatably connected to the upper link and the lower link so that the upper link rotates in accordance with a rotation of the lower link, wherein the connection link and the upper link rotate with respect to one another about a first rotating axis, and wherein the connection link and the lower link rotate with respect to one another about a second rotating axis; and
   a driving unit which rotates the lower link,
   wherein the upper link and the column rotate with respect to one another about a third rotation axis,
   wherein the upper link and the carrying arm rotate with respect to one another about a fourth rotation axis, and
   wherein the third rotation axis is positioned between the fourth rotation axis and the first rotation axis.

2. The substrate carrying apparatus according to claim 1, wherein the driving unit comprises:
   a linear motion mechanism having a linear motion unit which is driven by a driving source and linearly reciprocates between a pair of moving ends along the horizontal direction orthogonal to the rotation axes of the upper link and the lower link; and
   a conversion unit which connects the linear motion unit and the lower link and converts a movement of the linear motion unit to the rotation of the lower link.

3. The substrate carrying apparatus according to claim 2, wherein the driving unit is arranged between the moving ends at a side distal from the carrying arm.

4. The substrate carrying apparatus according to claim 2, wherein when the carrying arm is in a lower moving end, the linear motion unit is arranged between the moving ends which is at a side distal from the carrying arm.

5. The substrate carrying apparatus according to claim 2, wherein the driving unit drives the linear motion unit by single driving source.

6. The substrate carrying apparatus according to claim 1, wherein:
   an interior of a lifting link which includes and is configured by the column, the upper link, the lower link, the connection link, and a plurality of connection portions therebetween are communicated with each other so that air can pass therethrough, and
   the interior of the lifting link includes an exhaustion port to exhaust air from the driving unit.

7. The substrate carrying apparatus according to claim 1, wherein the driving unit is arranged at a position lower than an opening of a chamber which performs processing to the substrate.

8. The substrate carrying apparatus according to claim 1, wherein the carrying arm is rotatably provided in the horizontal direction and includes a pair of an upper arm and a lower arm housed at positions that overlap with each other.

9. The substrate carrying apparatus according to claim 1, wherein the first rotating axis and the second rotating axis move up and down in a direction opposite to a moving direction of the carrying arm.

10. The substrate carrying apparatus according to claim 1, wherein:
- the first rotating axis is configured to move up and down from a position above a connecting portion between the column and the upper link to a position below, and
- the second rotating axis is configured to move up and down from a position above the connecting portion between the column and the lower link to a position below.

* * * * *